(12) United States Patent
Park et al.

(10) Patent No.: US 9,564,318 B2
(45) Date of Patent: Feb. 7, 2017

(54) METHOD OF MANUFACTURING NANOWIRE ARRAY USING INDUCED GROWTH

(71) Applicant: POSTECH ACADEMY-INDUSTRY FOUNDATION, Gyeongsangbuk-do (KR)

(72) Inventors: Jun Hyuk Park, Gyeonggi-do (KR); Jong Kyu Kim, Gyeongsangbuk-do (KR); Sun Yong Hwang, Jeollanam-do (KR)

(73) Assignee: POSTECH ACADEMY-INDUSTRY FOUNDATION, Gyeonsangbuk-Do (KR)

( * ) Notice: Subject to any disclaimer, the term of this patent is extended or adjusted under 35 U.S.C. 154(b) by 0 days.

(21) Appl. No.: 14/975,865

(22) Filed: Dec. 21, 2015

(65) Prior Publication Data

US 2016/0189960 A1 Jun. 30, 2016

(30) Foreign Application Priority Data

Dec. 24, 2014 (KR) ........................ 10-2014-0187927

(51) Int. Cl.
*H01L 21/02* (2006.01)
*H01L 21/47* (2006.01)

(52) U.S. Cl.
CPC ..... *H01L 21/02603* (2013.01); *H01L 21/0242* (2013.01); *H01L 21/0254* (2013.01); *H01L 21/0262* (2013.01); *H01L 21/02458* (2013.01); *H01L 21/02639* (2013.01); *H01L 21/47* (2013.01)

(58) Field of Classification Search
CPC ............. H01L 21/02603; H01L 21/02458; H01L 21/0242; H01L 21/47; H01L 21/0254; H01L 21/0262; H01L 21/02639
See application file for complete search history.

(56) References Cited

U.S. PATENT DOCUMENTS

2014/0367834 A1* 12/2014 Patolsky ........... H01L 21/02603
257/618

FOREIGN PATENT DOCUMENTS

| KR | 10-1367374 B1 | 3/2014 |
| KR | 10-1421130 B1 | 7/2014 |
| KR | 10-1439788 B1 | 9/2014 |

* cited by examiner

*Primary Examiner* — Kyoung Lee
(74) *Attorney, Agent, or Firm* — Revolution IP, PLLC

(57) ABSTRACT

Provided is a method of manufacturing a nanowire array using induced growth, in which a nitride inorganic nanowire is grown from a nitride seed by forming the nitride seed on a sapphire or silicon substrate, forming an organic nanowire pattern and a dielectric nanotunnel using the nanowire pattern as a template on the nitride seed, and using the nanotunnel as an induced growth mask.

27 Claims, 17 Drawing Sheets

(CROSS-SECTION ALONG LINE c-c)

(CROSS-SECTION ALONG LINE d-d)

(CROSS-SECTION ALONG LINE e-e)

(CROSS-SECTION ALONG LINE f-f)

(CROSS-SECTION ALONG LINE g-g)

(CROSS-SECTION ALONG LINE h-h)

(CROSS-SECTION ALONG LINE i-i)

(CROSS-SECTION ALONG LINE j-j)

FIG. 1k
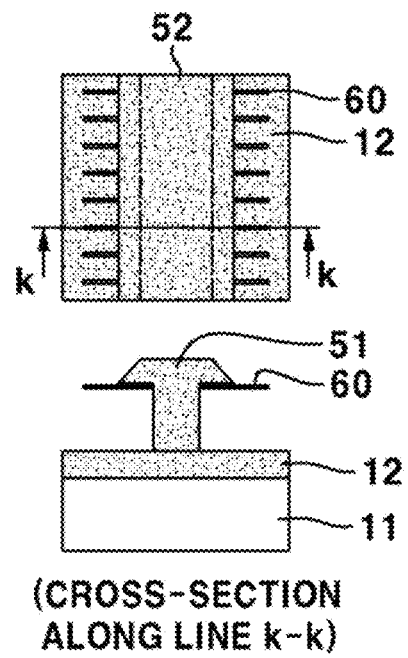
(CROSS-SECTION ALONG LINE k-k)
FIG. 2a
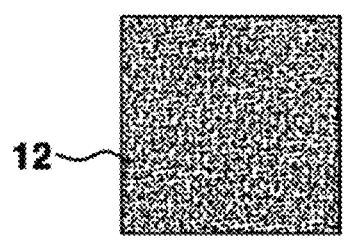

FIG. 2b
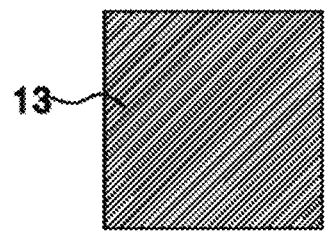
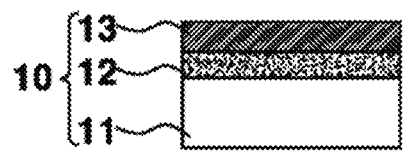
FIG. 2c
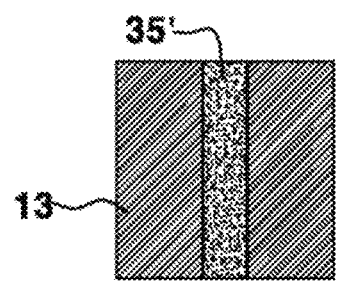
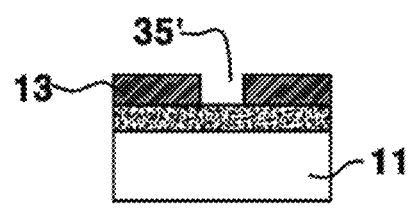

(CROSS-SECTION ALONG LINE d-d)

(CROSS-SECTION ALONG LINE e1-e1)

(CROSS-SECTION ALONG LINE e2-e2)    (CROSS-SECTION ALONG LINE e3-e3)

(CROSS-SECTION ALONG LINE h1-h1)

(CROSS-SECTION ALONG LINE h2-h2)

(CROSS-SECTION ALONG LINE i-i)

FIG. 2j
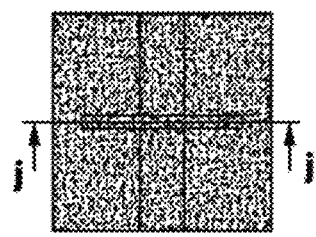
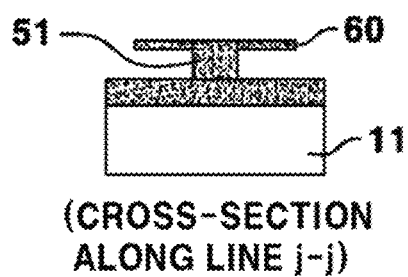
(CROSS-SECTION ALONG LINE j-j)
FIG. 2k
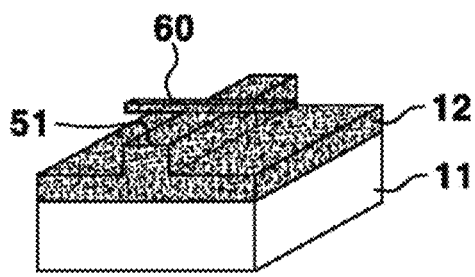

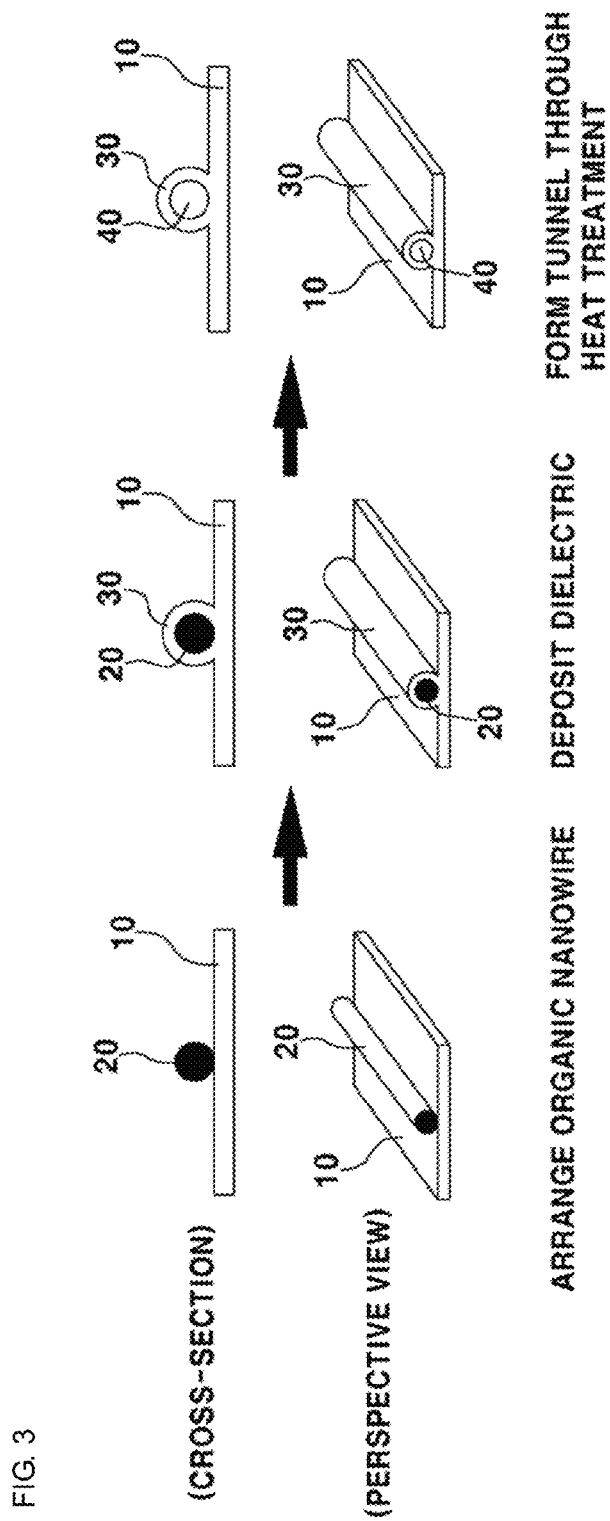

METHOD OF MANUFACTURING NANOWIRE ARRAY USING INDUCED GROWTH

CROSS REFERENCE TO PRIOR APPLICATIONS

This application claims priority under 35 U.S.C. §119 to Korean Patent Application No. KR 10-2014-0187927 filed on Dec. 24, 2014, which is hereby incorporated by reference in its entirety.

BACKGROUND OF THE INVENTION

1. Field of the Invention

The present invention relates to a method of growing a nanowire array, and more particularly, to a method of manufacturing a nanowire array using induced growth, in which nanotunnels are formed by using an organic nanowire array as a template and an aligned inorganic nanowire array is then formed by induced growth through the nanotunnels.

2. Description of the Related Art

Semiconductor nanowires, as an advanced device that may exceed the limitations of conventional semiconductor technology, have been recognized as an innovative key technology in various semiconductor application areas and have been particularly in the spotlight in electronic and optical device applications. In the electronic device applications, a significant amount of research related to transistors and memory devices using nanowires has been conducted. Research into solar cells and light-emitting devices in the optical device applications and research using nanoscale material characteristics in a laser field have been actively conducted, and particularly, excellent semiconductor characteristics of a one-dimensional nanostructured semiconductor have been reported.

However, inorganic semiconductor nanowires (Group IV semiconductors and compound semiconductors), which have been typically reported, are typically grown in a vertically aligned structure, and accurate length and diameter control may not only be difficult, but it may also be impossible to accurately adjust the number of nanowires. In particular, even if an array having a vertically aligned structure is grown, it is highly difficult, in terms of processing, to apply the individual nanowire or nanowire array to an optical device or electronic device. When the formation of a horizontal array as well as the adjustment of individual structure or position of the nanowire is possible, a nanowire device may be actually used.

Thus, there has been a lot of efforts to constantly align nanowires at a desired position. There are two main methods of obtaining aligned nanowires which include (i) a method of using an alignment process after the growth of nanowires, and (ii) a method of directly growing aligned nanowires. The alignment of nanowires may be performed in such a manner that nanowires are dispersed in a solution and the nanowires are aligned by using fluidic channel, Langmuir-Blodgett, blown-bubble, contact printing, and electromagnetic field. Also, in a case in which a nanowire array is directly grown, a method of making a growth template through pre-patterning is used. For example, in growing vertical nanowires through vapor-liquid-solid (VLS) growth, when catalysts are prepared through a method, such as electron beam lithography or deep ultraviolet lithography, and nanowires are then grown, a vertically aligned nanowire array is formed only at a position patterned in advance. However, the method has limitations in that the patterning method may be difficult to provide a large-area pattern, may be expensive, and may only provide the array having a vertically aligned shape. Recently, professor Tsivion et al. have succeeded in directly growing horizontally aligned nanowires on a substrate using a miscut of the substrate (see D. Tsivion, M. Schvartzman, R. Popovitz-Biro, P. von Huth, E. Joselevich, $\Sigma\chi\iota\in\nu\chi\in$, 333, 1003(2011)). Although it is a very successful method in terms of the fact that gallium nitride nanowires may be grown on a sapphire substrate in a desired crystal direction, it is difficult to accurately control the number of nanowires as well as the diameter and length of the individual nanowire. In addition, the method may have a limitation in that crystallographically restricted planes may only be used in the growth.

Thus, in order to use an inorganic nanowire array in an actual device, there is a need to develop a method of forming nanowires which may accurately control the structure of the nanowire as well as crystal orientation. With respect to an organic nanowire technique, semiconductor properties of nanowires are inferior to those of a single crystal inorganic material. However, since flexibility may be excellent and the technique may have advantages such as mass synthesis, solution process, and low costs, there is a need to conduct continuous research.

PRIOR ART DOCUMENTS

Patent Documents (Patent Document 1) Korean Patent No. 10-1421130 (publicized on Jul. 18, 2014)

(Patent Document 2) Korean Patent No. 10-1439788 (publicized on Sep. 15, 2014)

(Patent Document 3) Korean Patent No. 10-1367374 (publicized on Mar. 19, 2014)

SUMMARY OF THE INVENTION

The present invention addresses the above-identified, and other problems associated with conventional methods and apparatuses.

An aspect of the invention provides a method of manufacturing a horizontally aligned inorganic nanowire array in which position and structure are accurately controlled.

Another aspect of the invention provides a method of stably forming inorganic nanowires by induced growth of the inorganic nanowires using organic nanowires, which may easily form a pattern or shape, as a template.

Another aspect of the invention provides a method of manufacturing nanowires in a desired shape by forming organic nanowires in a desired shape, such as orientation, size, and predetermined pattern of the nanowires, and using the organic nanowires as a template.

According to an embodiment of the invention, there is provided forming an organic nanowire array, as a template, on a base layer including a substrate, as any one of materials on which selective growth of nitride is possible, using a nozzle printing method or the like; forming a dielectric on the organic nanowire array by a method with good step coverage (PECVD, sputtering, etc.); forming a dielectric nanotunnel by removing an organic nanowire; forming a seed crystal for induced growth; performing the induced growth of nanowire; and removing the dielectric.

According to another embodiment of the invention, there is provided forming a nanowire branch by removing a dielectric.

According to another embodiment of the invention, there is provided a method of manufacturing a nanowire array using induced growth including: a first nanowire forming step of forming a first nanowire on a base layer including a substrate; a nanomask layer forming step of forming a nanomask layer on the first nanowire; a nanotunnel forming step of forming a nanotunnel by removing the first nanowire after the formation of the nanomask layer; and a second nanowire forming step of forming a second nanowire in the nanotunnel by induced growth.

In the invention, the substrate includes any one of: nitride having any one of C-plane, M-plane, A-plane, and R-plane; nitride having a plane equivalent to any one of C-plane, M-plane, A-plane, and R-plane; sapphire having C-plane or R-plane; sapphire having a plane equivalent to C-plane or R-plane; (111) plane silicon; 6H—SiC; and a material in which a difference in lattice constants between the material and nitride is within 10%.

In the invention, the substrate includes any one of: polycrystalline nitride; an amorphous material including at least one selected from the group consisting of $SiO_x$ (x=0.5 to 2.5), $SiN_x$ (x=0.5 to 2.5), $Al_2O_3$, GaO, ZnO, LiAlO, and MgO; and a material having a surface layer formed of graphene.

In the invention, the first nanowire includes an organic nanowire of an organic material.

In the invention, the first nanowire includes any one low-molecular-weight organic material of: 6,13-bis(triisopropylsilylethynyl) (TIPS) pentacene; triethylsilylethynyl anthradithiophene (TES ADT); and [6,6]-phenyl C61 butyric acid methyl ester (PCBM).

In the invention, the first nanowire, as a polymer organic semiconductor or a conductive polymer material, includes any one of: a polythiophene derivative including poly(3-hexylthiophene) (P3HT) and poly(3,4-ethylenedioxythiophene) (PEDOT); poly(9-vinylcarbazole) (PVK); poly(p-phenylene vinylene); polyfluorene; polyaniline; and polypyrrole or a derivative thereof.

In the invention, the first nanowire, as an insulating polymer material, includes any one of: polyethylene oxide (PEO); polystyrene (PS); polycaprolactone (PCL); polyacrylonitrile (PAN); poly(methyl methacrylate) (PMMA); polyimide; poly(vinylidene fluoride) (PVDF); and polyvinylchloride (PVC).

In the invention, the nanomask layer includes any one of $SiO_x$(x=0.5 to 2.5), $SiN_x$(x=0.5 to 2.5), $Al_2O_3$, and GaO.

In the invention, the second nanowire includes any one inorganic material of: $Al_xGa_yIn_{1-x-y}N$ (0≤x≤1, 0≤y≤1); $Al_xGa_yIn_{1-x-y}As$ (0≤x≤1, 0≤y≤1); and $Al_xGa_yInP$ (0≤x≤1, 0≤y≤1).

In the invention, the second nanowire includes a nitride nanowire, and, in the second nanowire forming step, a nitride nanowire is formed by induced growth of a nitride from a seed layer formed on the substrate.

In the invention, in the nanotunnel forming step, the nanomask layer is formed by using the organic nanowire as a template and the nanotunnel is formed by removing the organic nanowire through a heat treatment process.

In the invention, in the nanotunnel forming step, the nanotunnel is formed by removing the organic nanowire through a heat treatment at a temperature of 100° C. to 500° C.

In the invention, the base layer has any one layer structure of: a layer structure including the substrate; a layer structure including the substrate and a first seed layer formed on the substrate; and a layer structure including the substrate, the first seed layer formed on the substrate, and a first growth mask layer formed on the first seed layer.

In the invention, the first seed layer includes any one of: $Al_xGa_yIn_{1-x-y}N$ (0≤x≤1, 0≤y≤1); $Al_xGa_yIn_{1-x-y}As$ (0≤x≤1, 0≤y≤1); and $Al_xGa_yInP$ (0≤x≤1, 0≤y≤1).

In the invention, the first growth mask layer includes any one of $SiO_x$(x=0.5 to 2.5), $SiN_x$(x=0.5 to 2.5), $Al_2O_3$, and GaO.

In the invention, the first nanowire forming step is performed by any one method of: a method of forming an organic nanowire using a nozzle printer; nanoimprint lithography; electron beam lithography; a solution deposition method; a vapor transport method; a solution annealing method; an anodized aluminum template method; and a direct tip drawing method.

In the invention, the nanomask layer forming step is performed by any one method of plasma enhanced chemical vapor deposition (PECVD), chemical vapor deposition (CVD), sputtering, and atomic layer deposition (ALD).

In the invention, the second nanowire forming step is performed by any one of metal organic chemical vapor deposition (MOCVD), CVD, and a solution process, wherein the induced growth of the second nanowire is performed along the nanotunnel.

According to another embodiment of the invention, there is provided a method of manufacturing a nanowire array using induced growth including: a first seed layer forming step of forming a first seed layer on a substrate; a first growth mask layer forming step of forming a first growth mask layer on the first seed layer; a first nanowire forming step of forming an organic first nanowire on the first growth mask layer; a nanomask layer forming step of forming a dielectric nanomask layer on the first nanowire; a seed tunnel forming step of forming a predetermined seed tunnel by etching the first growth mask layer, the first nanowire, and the nanomask layer; a nanotunnel forming step of forming a nanotunnel by removing the organic first nanowire; a second seed layer forming step of forming a second seed layer from the first seed layer in the seed tunnel; a second growth mask layer forming step of forming a second growth mask layer on the second seed layer; an induced growth etching step of etching a predetermined area of the second growth mask layer for nano-induced growth; a second nanowire forming step of forming a second nanowire from the second seed layer in the nanotunnel by induced growth; and a mask removing step of removing the nanomask layer, the first growth mask layer, and the second growth mask layer.

In the invention, the second nanowire includes a nitride nanowire, and, in the second nanowire forming step, a nitride nanowire is formed by induced growth of a nitride from the second seed layer.

In the invention, the first nanowire includes an organic nanowire of an organic material, and, in the nanotunnel forming step, the nanomask layer is formed by using the organic nanowire as a template and the nanotunnel is formed by removing the organic nanowire through a heat treatment process, wherein the heat treatment process forms the nanotunnel by removing the organic nanowire through a heat treatment at a temperature of 100° C. to 500° C.

In the invention, the seed tunnel forming step includes a dry etching process or a wet etching process.

In the invention, the second seed layer forming step is performed by any one of metal organic chemical vapor deposition (MOCVD), molecular beam epitaxy (MBE), sputtering, and electron beam deposition to form the second seed layer of a nitride structure.

According to another embodiment of the invention, there is provided a method of manufacturing a nanowire array using induced growth including: a first seed layer forming step of forming a first seed layer on a substrate; a first growth mask layer forming step of forming a first growth mask layer on the first seed layer; a seed tunnel forming step of forming a seed tunnel by etching a predetermined area of the first growth mask layer; a first nanowire forming step of forming a first nanowire on the first growth mask layer; a nanomask layer forming step of forming a nanomask layer on the first nanowire; a nanotunnel forming step of forming a nanotunnel by removing the organic first nanowire after the formation of the nanomask layer; a second nanowire forming step of forming a second nanowire from the first seed layer in the seed tunnel and the nanotunnel by induced growth; and a mask removing step of removing the nanomask layer and the first growth mask layer.

In the invention, the second nanowire includes a nitride nanowire, and, in the second nanowire forming step, a nitride nanowire is formed by induced growth of a nitride from the first seed layer.

In the invention, the first nanowire includes an organic nanowire of an organic material, and, in the nanotunnel forming step, the nanomask layer is formed by using the organic nanowire as a template and the nanotunnel is formed by removing the organic nanowire through a heat treatment process, wherein the heat treatment process forms the nanotunnel by removing the organic nanowire through a heat treatment at a temperature of 100° C. to 500° C.

According to another embodiment of the invention, there is provided a nanostructure including: a seed tunnel having a predetermined depth prepared by etching a predetermined area of a first growth mask layer; and a nanotunnel having one side thereof connected to the seed tunnel, which is covered with a mask layer and constitutes a through-hole, wherein the first growth mask layer having a predetermined thickness is formed on a first seed layer on a substrate.

BRIEF DESCRIPTION OF THE DRAWINGS

FIGS. 1a-1k illustrate a step-by-step flowchart of an embodiment of step seed growth, in which a seed is stepwise grown, in a method of manufacturing a nanowire array according to the invention;

FIGS. 2a-2k illustrate a step-by-step flowchart of an embodiment of batch seed growth, in which a seed is grown batchwise, in the method of manufacturing a nanowire array according to the invention;

FIG. 3 is an exemplary view briefly illustrating a process of forming a nanotunnel from a nanowire in the method of manufacturing a nanowire array according to the invention;

FIG. 5 is scanning electron microscope images of a $SiO_2$ nanotunnel, which is formed by sputter deposition of $SiO_2$ on a PVK organic nanowire and performing a heat treatment at 400° C. for 2 hours, in the method of manufacturing a nanowire array according to the invention, wherein

DETAILED DESCRIPTION OF THE EXEMPLARY EMBODIMENTS

Figure 1A:
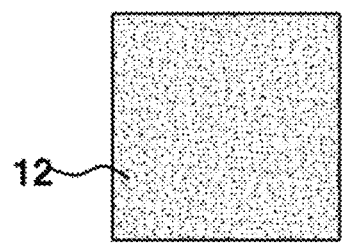

Hereinafter, the invention will be described in detail with reference to the accompanying drawings.

That is, a method of manufacturing a nanowire array using induced growth according to the invention and a device manufactured by the manufacturing method relate to a method of forming a nanowire having a predetermined length as well as a small thickness on a base including a substrate and a device.

In general, a nanowire may be variously used in a semiconductor process, and it may be difficult to perfectly realize the nanowire in a shape desired by the worker even if the nanowire has a nanoscale size.

Thus, in the invention, a nanowire and a nanowire array are formed by using various nanotechniques, wherein the invention is to obtain more precise arrangement and shape.

A method of manufacturing a nanowire array using induced growth according to the invention will be schematically described below.

First, a first nanowire forming step S200 of forming a first nanowire 20 on a base layer 10 including a substrate 11 is performed.

The first nanowire 20 is formed on the base layer 10, wherein the base layer 10 may be composed of a plurality of layers including the substrate.

That is, as an example of the base layer 10, the base layer 10 may have a layer structure including only the substrate 11 or may have a layer structure including the substrate 11 and a first seed layer 12 formed on the substrate 11.

Furthermore, the base layer 10 may have a layer structure which is composed of multilayers including the substrate 11, the first seed layer 12, and a first growth mask layer 13 formed on the first seed layer 12.

The layer structure of the base layer 10 will be determined appropriately according to the state of implementation.

Thus, the first nanowire 20 is formed on the base layer 10, a portion of the first nanowire 20 becomes a nanotunnel by the subsequent step, and a second nanowire, as the final nanowire, is formed in the nanotunnel, wherein, a seed, which will be the basis for the formation of the second nanowire using induced growth, is on the base layer 10 or a layer configuration of the seed for the induced growth of the second nanowire may be formed during the subsequent process.

That is, in a case in which only the substrate 11 is formed, a seed layer is formed by a separate process in a process after the formation of the first nanowire on the substrate, and thus, a second nanowire may be formed from the seed layer in the nanotunnel by the induced growth.

Also, as the base layer 10, a first seed layer is formed on the substrate and a first nanowire may then be formed on the first seed layer. In the subsequent process, a nanotunnel is prepared from the first nanowire and a second nanowire may be formed from the first seed layer in the nanotunnel by the induced growth.

In addition, as in a first embodiment and a second embodiment of FIGS. 1a-1k and FIGS. 2a-2k which will be described later, the first seed layer 12 may be formed on the substrate 11, the first growth mask layer 13 may be formed on the first seed layer 12, and the first nanowire 20 may be then formed on the first growth mask layer 13.

With respect to the first and second embodiments, since the first nanowire 20 is formed on the first growth mask layer 13 which is formed last among the components of the base layer 10, it may be understood that this configuration is related to the shape of the second nanowire, for example, a height of the second nanowire corresponds to a height of the first growth mask layer 13.

Thus, the configuration or thickness of the base layer 10 will be determined appropriately according to the state of implementation, for example, the height of the first growth mask layer 13 is determined appropriately according to the formation mode of the finally formed second nanowire.

In addition, as a material of the base layer 10, the substrate 11 may be formed of any one of nitride having any one of C-plane, M-plane, A-plane, and R-plane; nitride having a plane equivalent to any one of C-plane, M-plane, A-plane, and R-plane; sapphire having C-plane or R-plane; sapphire having a plane equivalent to C-plane or R-plane; (111) plane silicon; 6H—SiC; and a material in which a difference in lattice constants between the material and nitride is within 10%.

Also, the substrate 11 may be formed of any one of polycrystalline nitride; an amorphous material including at least one selected from the group consisting of $SiO_x$ (x=0.5 to 2.5), $SiN_x$ (x=0.5 to 2.5), $Al_2O_3$, GaO, ZnO, LiAlO, and MgO; and a material having a surface layer formed of graphene, and particularly, the substrate 11 may be formed of $SiO_2$ and SiN.

The first seed layer 12, a second seed layer 51 grown by using the first seed layer 12 as a seed, and a second nanowire 60 grown by using the second seed layer 51 as a seed are formed of any one inorganic material of $Al_xGa_yIn_{1-x-y}N$ (0≤x≤1, 0≤y≤1); $Al_xGa_yIn_{1-x-y}As$ (0≤x≤1, 0≤y≤1); and $Al_xGa_yInP$ (0≤x≤1, 0≤y≤1), and particularly, the first seed layer 12, second seed layer 51, and second nanowire may be formed of a nitride.

That is, the second seed layer 51 is formed of a nitride, wherein the second seed layer 51 becomes a seed for subsequently forming the second nanowire or a seed layer of another second nanowire.

Also, the first growth mask layer 13 is formed of any one of $SiO_x$ (x=0.5 to 2.5), $SiN_x$ (x=0.5 to 2.5), $Al_2O_3$, and GaO, wherein the first growth mask layer 13, for example, may be formed of $SiO_2$.

The first nanowire 20 is formed on the base layer 10 thus prepared, and the first nanowire 20 is formed of an organic nanowire of an organic material.

The first nanowire 20, which is formed of the organic nanowire of the organic material, may be formed of any one low-molecular-weight organic material of 6,13-bis(triisopropylsilylethynyl) (TIPS) pentacene; triethylsilylethynyl anthradithiophene (TES ADT); and [6,6]-phenyl C61 butyric acid methyl ester (PCBM).

The first nanowire 20, as a polymer organic semiconductor or conductive polymer material, may be formed of any one of a polythiophene derivative including poly(3-hexylthiophene) (P3HT) and poly(3,4-ethylenedioxythiophene) (PEDOT); poly(9-vinylcarbazole) (PVK); poly(p-phenylene vinylene); polyfluorene; polyaniline; and polypyrrole or a derivative thereof.

The first nanowire 20, as an insulating polymer material, may be formed of any one of polyethylene oxide (PEO); polystyrene (PS); polycaprolactone (PCL); polyacrylonitrile (PAN); poly(methyl methacrylate) (PMMA); polyimide; poly(vinylidene fluoride) (PVDF); and polyvinylchloride (PVC).

Particularly, the organic material may be poly(9-vinylcarbazole) (PVK).

The first nanowire forming step S200 of forming the first nanowire 20, as an organic nanowire, on the base layer 10 may be performed by any one method of: a method of forming an organic nanowire using a nozzle printer; nanoimprint lithography; electron beam lithography; a solution deposition method; a vapor transport method; a solution annealing method; an anodized aluminum template method; and a direct tip drawing method.

A nanomask layer forming step S300 of forming a nanomask layer 30 on the first nanowire 20 thus formed is performed.

The nanomask layer 30 is formed of any one of $SiO_x$ (x=0.5 to 2.5), $SiN_x$ (x=0.5 to 2.5), $Al_2O_3$, and GaO, and may be formed of $SiO_2$.

That is, since the first nanowire 20 is formed on the first growth mask layer 13 in a state in which the first growth mask layer 13 is formed on the base layer 10, the nanomask layer 30 is formed on the first nanowire 20. Thus, since the first growth mask layer and the nanomask layer 30 are formed of $SiO_2$, a state is obtained in which both mask layers of $SiO_2$ surround the first nanowire 20 disposed in the middle.

Thus, when the first nanowire 20 is removed in the subsequent process, portions surrounded by the mask layers of $SiO_2$ may easily form a nanotunnel.

The nanomask layer forming step S300 is performed by any one method of plasma enhanced chemical vapor deposition (PECVD), chemical vapor deposition (CVD), sputtering, and atomic layer deposition (ALD).

The nanomask layer 30 is formed on the first nanowire 20 as described above, and the first nanowire 20 is then removed to perform a nanotunnel forming step S500 of forming a nanotunnel 40.

As described above, the first nanowire 20 may be formed of an organic nanowire of an organic material and the first nanowire 20 of the organic material may be removed by a high-temperature heat treatment.

That is, in the nanotunnel forming step S500, the nanomask layer 30 is formed by using the organic nanowire as a template and the organic nanowire is then removed by a heat treatment process or a chemical treatment to form a nanotunnel.

In the nanotunnel forming step S500, a nanotunnel is formed by removing the organic nanowire by performing a heat treatment at a temperature of 100° C. to 500° C. as the heat treatment process. When the heat treatment temperature is less than 100° C., the organic material may not be completely removed, and when the heat treatment temperature is greater than 500° C., other components as well as the first nanowire may be damaged. Thus, the heat treatment process may be performed so as not to damage the other components while fast and effectively removing the first nanowire 20 as the organic material, for example, at about 400° C.

In an embodiment of step seed growth, as the first embodiment, and an embodiment of batch seed growth, as the second embodiment, which will be described later, seed tunnels 35 and 35' are formed around the first nanowire 20 before the removal of the first nanowire 20 by the heat treatment. Since the heat treatment process may be performed in a state in which the seed tunnels 35 and 35' are formed, the organic material of the first nanowire 20 may be removed through the seed tunnels 35 and 35' while being melted. Thus, the organic material may be effectively and fast removed. That is, the first nanowire 20 may be effectively removed by the formation of the seed tunnels 35 and 35'.

Thus, the nanotunnel 40, which is as large as the size of the first nanowire 20, may be formed by removing the first nanowire 20, as the organic material, between the first growth mask layer 13 formed on the base layer 10 and the nanomask layer 30.

Thereafter, a second nanowire forming step S700 of forming the second nanowire 60 on the nanotunnel 40 by induced growth is performed.

The second nanowire 60 may be formed of a compound material, such as $Al_xGa_yIn_{1-x-y}N$ ($0 \leq x \leq 1$, $0 \leq y \leq 1$); $Al_xGa_yIn_{1-x-y}As$ ($0 \leq x \leq 1$, $0 \leq y \leq 1$); and $Al_xGa_yInP$ ($0 \leq x \leq 1$, $0 \leq y \leq 1$), and, as the compound material, the second nanowire 60 may be formed of $In_{0.2}Ga_{0.8}N$ and $Al_{0.1}Ga_{0.9}As$ or may be formed of an inorganic material, for example, any one of GaN, InN, AlN, GaAs, InAs, AlAs, GaP, and InP. The second nanowire 60 may be formed of a nitride.

In the second nanowire forming step S700, a nitride nanowire is formed by the induced growth of a nitride from the seed layer formed on the substrate 11.

The second nanowire forming step S700 may be performed by any one of metal organic chemical vapor deposition (MOCVD), CVD, and a solution process, and the induced growth of the second nanowire 60 is performed along the nanotunnel 40.

For example, with respect to the embodiment of the step seed growth, as the first embodiment, which will be described later, the second seed layer 51 is formed in the seed tunnel 35 by using the first seed layer 12 formed on the substrate 11 of the base layer 10 as a seed, and subsequently, the second nanowire 60 is formed in the nanotunnel 40 connected to the second seed layer 51 by the induced growth using the second seed layer 51 as a seed.

Also, with respect to the embodiment of the batch seed growth, as the second embodiment, which will be described later, the second seed layer 51 and the second nanowire 60 are formed in the seed tunnel 35' and the nanotunnel 40 by the induced growth using the first seed layer 12 formed on the substrate 11 of the base layer 10 as a seed.

Eventually, the final second nanowire 60 is formed by the induced growth using the first seed layer 12 as the first seed.

The second nanowire thus formed is formed of a nitride like the first seed layer 12 and the second seed layer, and may have a shape appropriately according to the state of implementation, for example, the second nanowire may be formed of a single nanowire or may form an array having a predetermined pattern.

The invention relates to a device including at least one nanowire on a substrate, as a device manufactured by the method of manufacturing a nanowire array which is performed as described above.

Hereinafter, each step and configuration of each embodiment in the method of manufacturing a nanowire array using induced growth according to the invention will be described in more detail.

Example 1

First, as in the example of FIGS. 1a-1k, an embodiment of step seed growth, in which a first seed layer 12 was formed on a substrate 11 of a base layer 10 and a second seed layer 51 was then formed stepwise so as to optimally form a second nanowire 60 finally formed in a nanotunnel 40, as an intermediate step, will be examined.

Basic embodiment steps and materials constituting configurations for each step or layer configuration follow basic descriptions of the method of manufacturing a nanowire array of the invention which have been previously described.

In addition to the basic descriptions, detailed configuration and steps of the embodiment of the step seed growth, as the first embodiment, will be examined.

First, when a step of forming the base layer 10 and a first nanowire 20 is examined, a first seed layer forming step S110 of forming the first seed layer 12 on the substrate 11 was performed in the first embodiment.

That is, the first seed layer 12, as a basic seed layer, was formed on the substrate 11 as in FIG. 1a.

Figure 1B:
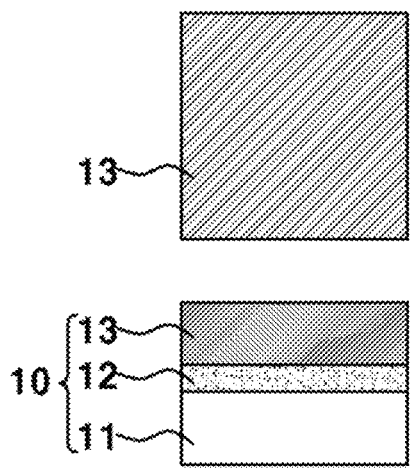

Next, as in FIG. 1b, a first growth mask layer forming step S120 of forming a first growth mask 13 on the first seed layer 12 was performed.

The first growth mask layer 13 may not only be a component constituting the nanotunnel 40 in the subsequent process, but may also form a height of the finally formed second nanowire 60.

That is, the first growth mask layer 13 may form a height gap between the first seed layer 12 and the finally formed second nanowire 60.

With respect to the embodiment of the step seed growth as the first embodiment of the method of manufacturing a nanowire array using induced growth according to the invention, a case was provided as an example in which the base layer 10 was composed of the substrate 11, the first seed layer 12, and the first growth mask layer 13 as in FIGS. 1a-1k.

Figure 1C:
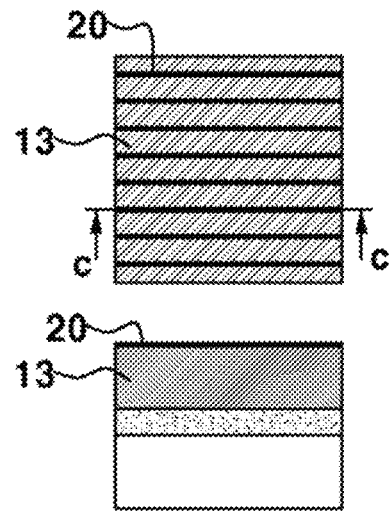
Figure 4:
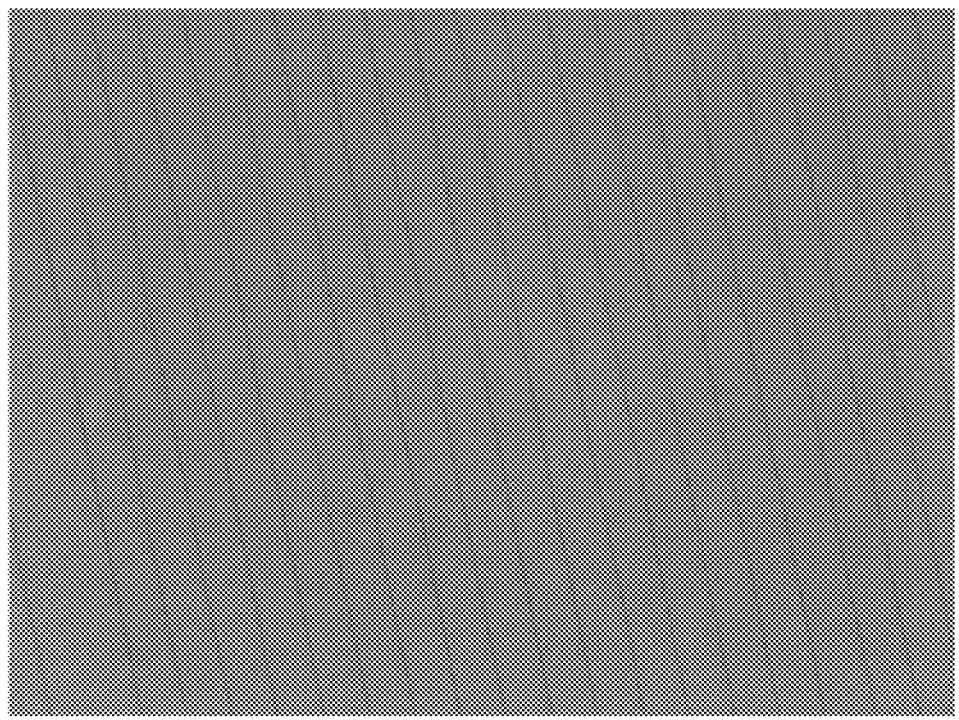
FIG. 4 is an optical microscope image of organic nanowires, which are formed by printing poly(N-vinylcarbazole) (PVK) nanowires on a $SiO_2$/GaN substrate with a spacing of 100 μm, in the formation of organic nanowires in the method of manufacturing a nanowire array according to the invention.

The base layer 10 was prepared as above, and thereafter, a first nanowire forming step S200 of forming the organic first nanowire 20 on the first growth mask layer 13 was performed as in FIG. 1c. An example of the first nanowire 20 thus formed may be seen in FIG. 4.

The first nanowire 20 was formed of an organic material and removed by a process such as a heat treatment, and a second nanowire, which was desired to be finally prepared at a position where the first nanowire was disposed, may then be prepared.

The first nanowire 20 had a nanoscale thickness, wherein various methods may be used as a method of forming the first nanowire as previously described.

Figure 1D:
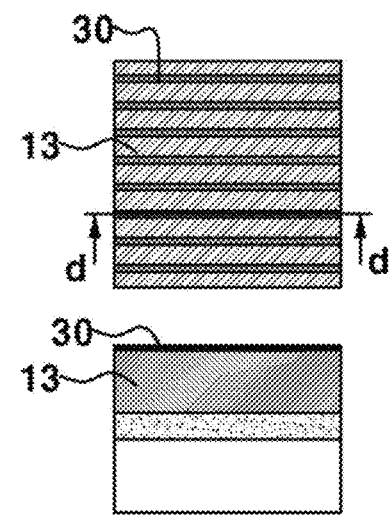

Thereafter, as in FIG. 1d, a nanomask layer forming step S300 of forming a dielectric nanomask layer 30 on the first nanowire 20 was performed.

In particular, as described above, the nanomask layer 30 surrounded the first nanowire 20 from the outside and, for example, the nanomask layer 30 may be formed of a material which had the same or similar characteristics as the first growth mask layer 13 which had previously been formed. After the formation of the second nanowire which was finally provided, the first growth mask layer and nanomask layer may be removed, and, in this case, the first growth mask layer and nanomask layer may be formed of a material having characteristics in which the first growth mask layer and nanomask layer may be equally removed during a removal process. For example, the first growth mask layer and nanomask layer are formed of $SiO_2$ so that the first growth mask layer and nanomask layer may be removed together.

Figure 1E:
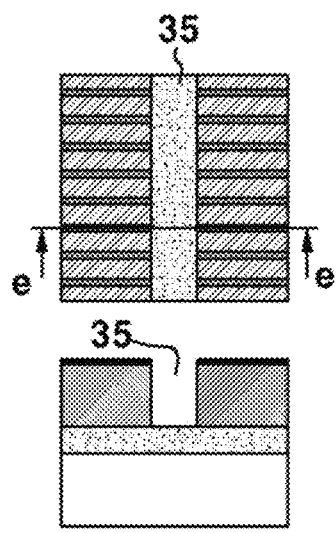

Thereafter, as in FIG. 1e, a seed tunnel forming step S410 of forming a predetermined seed tunnel 35 by etching the first growth mask layer 13, the first nanowire 20, and the nanomask layer 30 was performed.

Figure 5A:
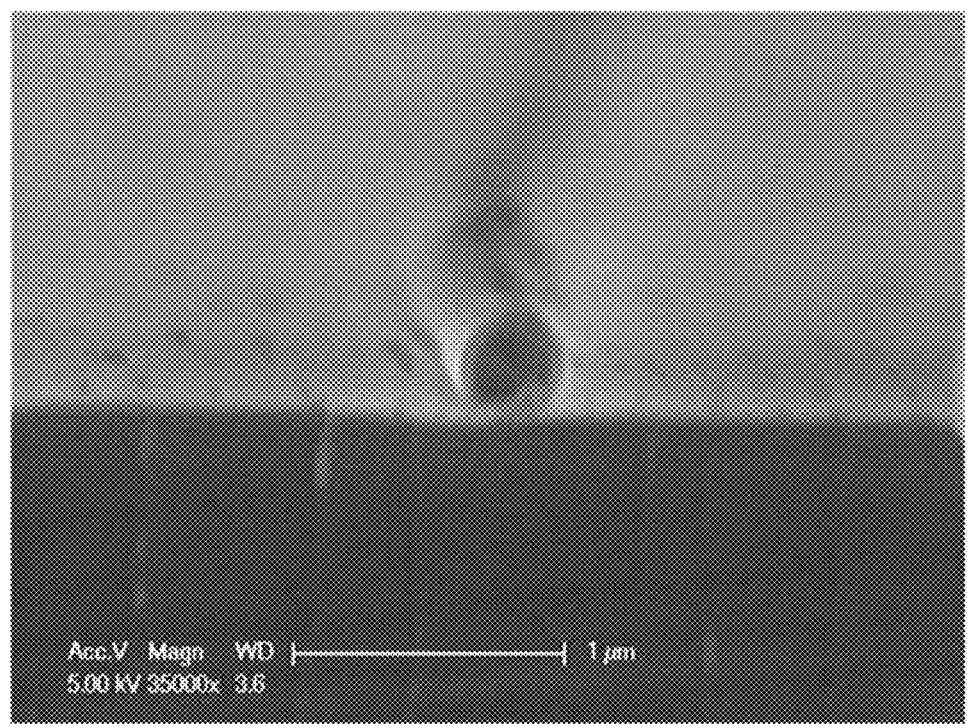
FIG. 5(a) is a perspective image and FIG. 5(b) is a cross-sectional image.
Figure 5B:
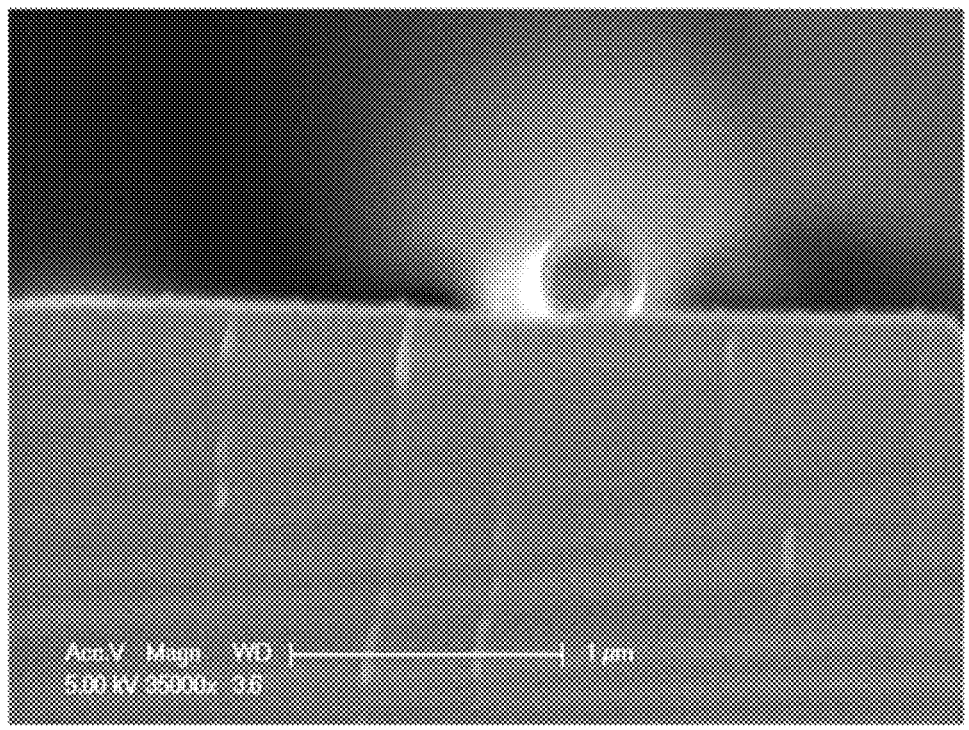
Figure 6:
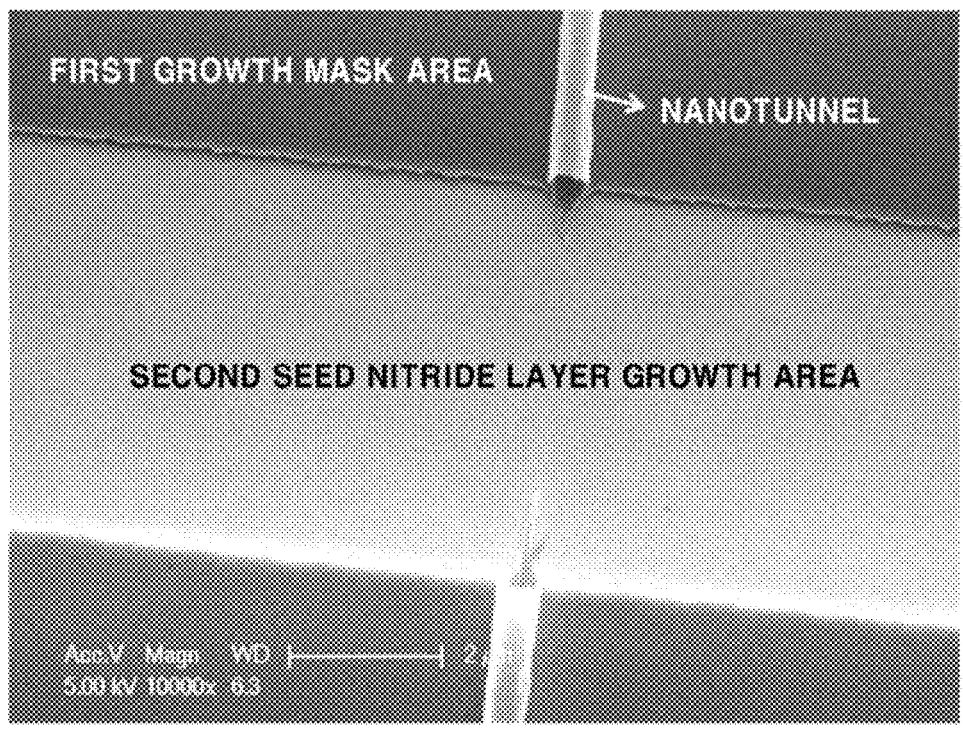
FIG. 6 is scanning electron microscope images of nanotunnel and seed tunnel after a seed tunnel forming process, in which a seed tunnel is formed by etching a first growth mask layer and a first nanowire in a first embodiment of the step seed growth, in the method of manufacturing a nanowire array according to the invention.
Figure 7:
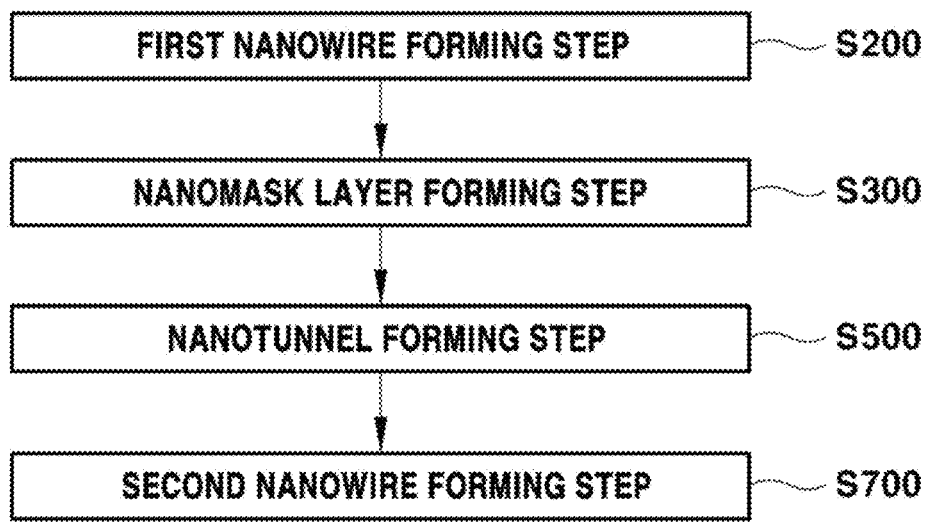
FIG. 7 illustrates a schematic flowchart of the method of manufacturing a nanowire array according to the invention.
Figure 8:
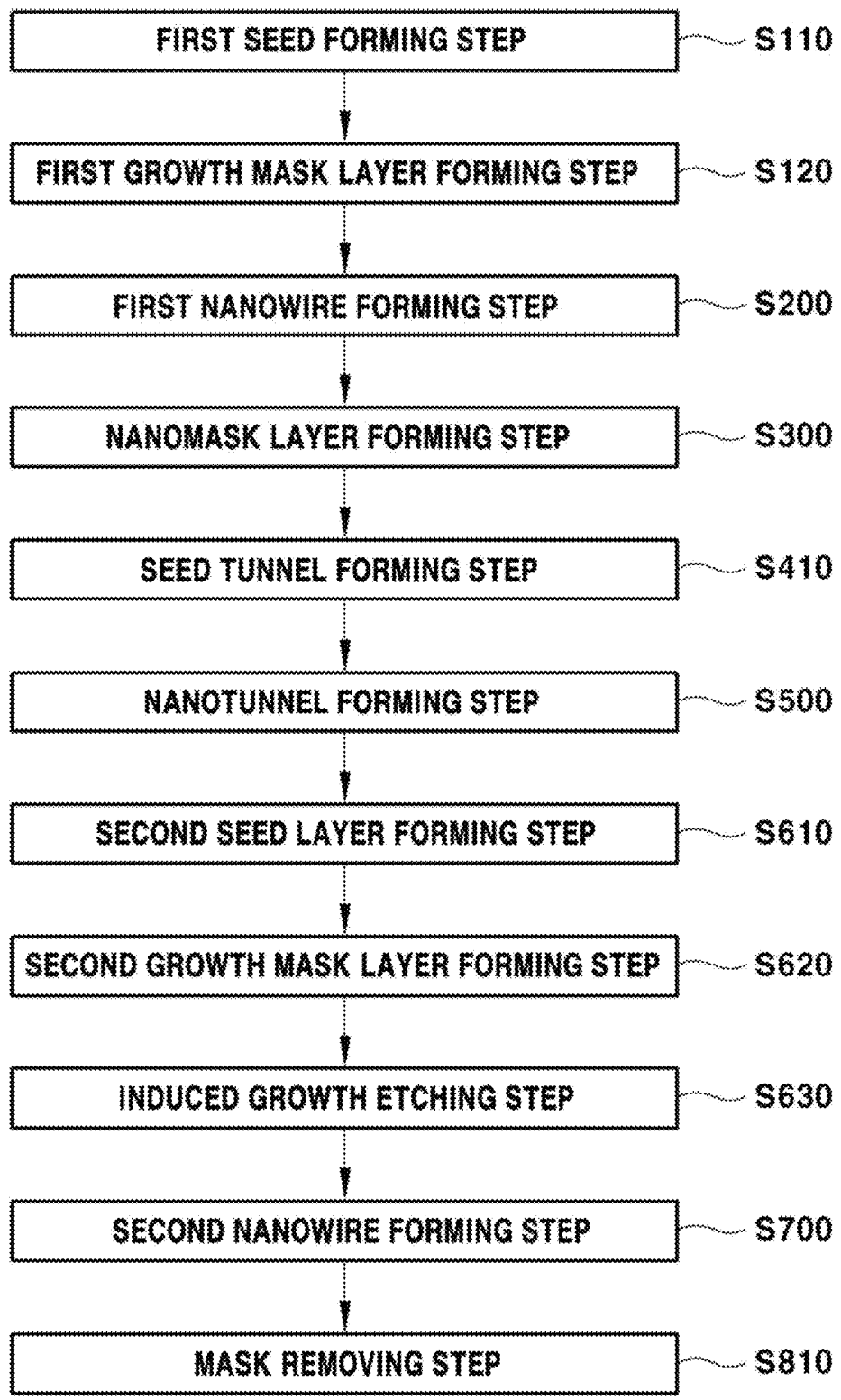
FIG. 8 illustrates a step-by-step flowchart of the first embodiment of the step seed growth, in which a seed is stepwise grown, in the method of manufacturing a nanowire array according to the invention.
Figure 9:
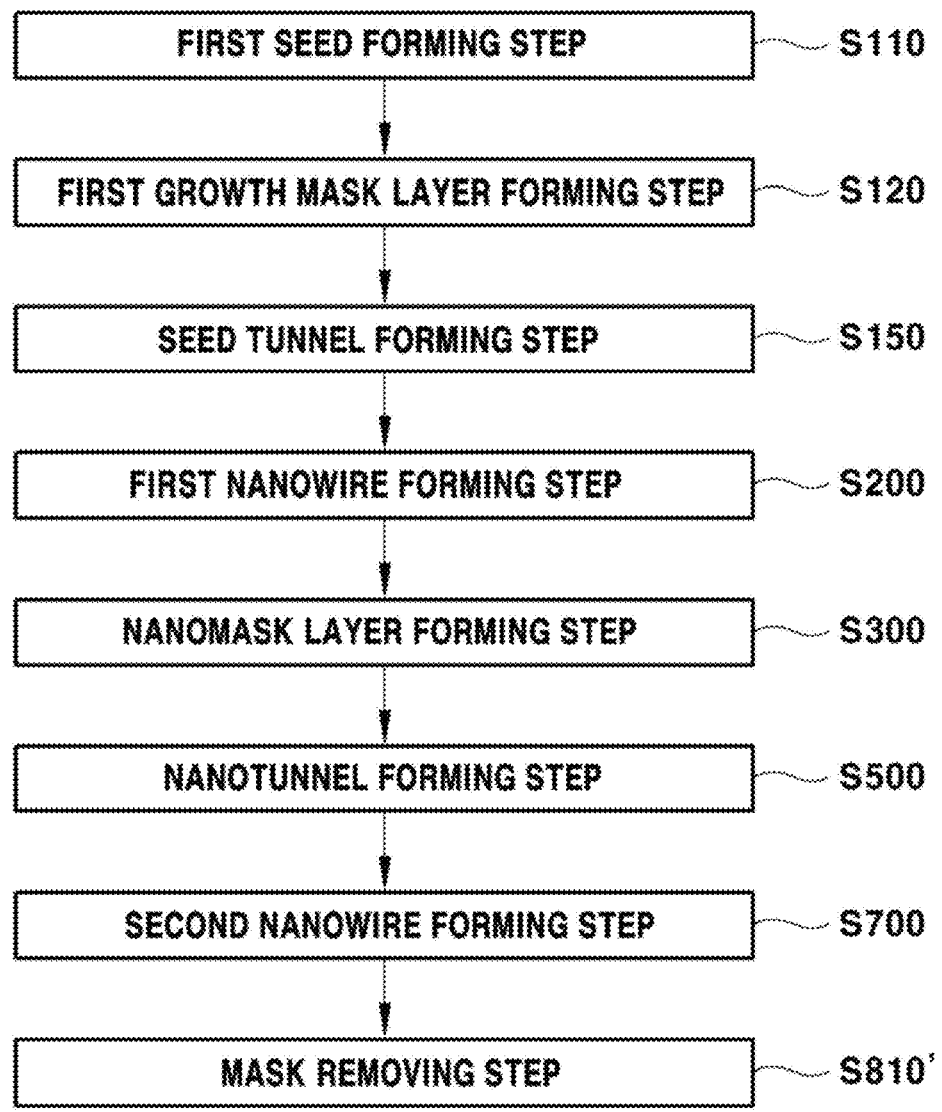
FIG. 9 illustrates a step-by-step flowchart of a second embodiment of the batch seed growth, in which a seed is grown batchwise, in the method of manufacturing a nanowire array according to the invention.

The seed tunnel 35 in the embodiment of the step seed growth may be formed by cutting the first nanowire 20 as in the examples of FIGS. 5 and 6.

First, the seed tunnel 35 may function as a seed connecting between the first seed layer 12 and the final second nanowire and may also be used as a passage for the removal of an organic material when removing the organic material of the first nanowire in the subsequent process. A dry etching process or wet etching process was used as a method of forming the seed tunnel 35.

In such a state, a nanotunnel forming step S500 of forming the nanotunnel 40 by removing the organic first nanowire 20 through a heat treatment was performed.

The first nanowire 20 as an organic material may be removed in a high-temperature state and the removed organic material may be discharged through the seed tunnel 35 previously formed. That is, as in the examples of FIGS. 5 and 6, since the seed tunnel 35 was formed by cutting the first nanowire 20, one side of the first nanowire 20 is in a state open to the seed tunnel 35, and thus, organic materials may be easily discharged and removed.

That is, the first nanowire 20 is formed of an organic nanowire of an organic material, the nanomask layer 30 was formed by using the organic nanowire as a template, and the nanotunnel forming step S500 may then form a nanotunnel by removing the organic nanowire through a heat treatment process.

The heat treatment process may form the nanotunnel by removing the organic nanowire through a heat treatment at a temperature of 100° C. to 500° C., wherein the heat treatment temperature may be 400° C.

Figure 1F:
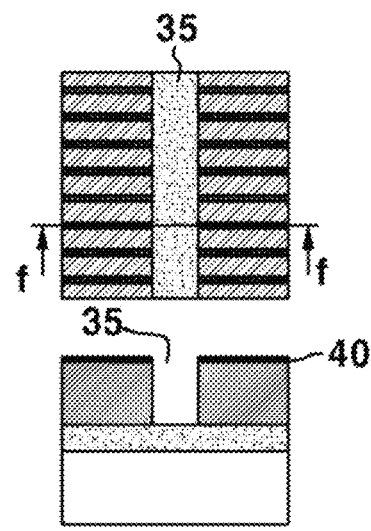

Next, as in FIG. 1f, a second seed layer forming step S610 of forming the second seed layer 51 from the first seed layer 12 in the seed tunnel 35 was performed. The second seed layer 51 was used as a seed for the second nanowire which was formed in the subsequent process. Also, the second seed layer 51 will be formed by induced growth using the first seed layer 12 as a seed. The second seed layer 51 may be formed of a nitride like the first seed layer 12 and the subsequent second nanowire.

In the second seed layer forming step S610, the second seed layer 51 of a nitride structure was formed by any one of MOCVD, molecular beam epitaxy (MBE), sputtering, and electron beam deposition.

Figure 1G:
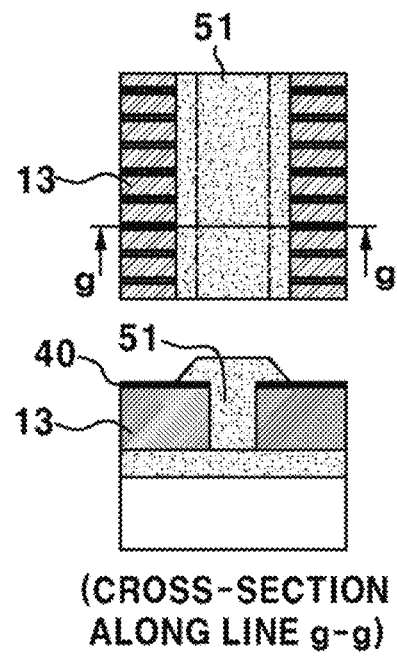

In addition, as in FIG. 1g, a second growth mask layer forming step S620 of forming a second growth mask layer 52 on the second seed layer 51 was performed. The second growth mask layer 52 may be formed of a dielectric ($SiO_2$).

Figure 1H:
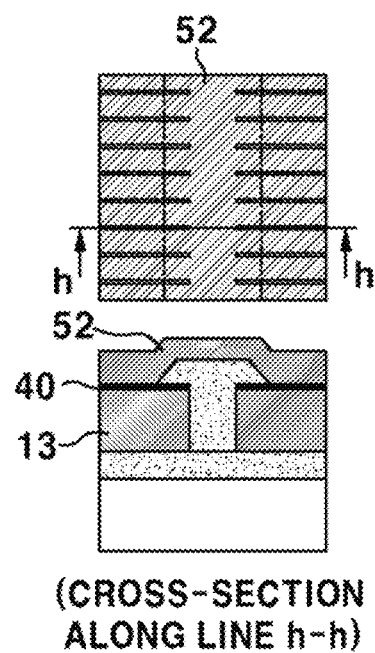

As in FIG. 1h, an induced growth etching step S630 of etching a predetermined area of the second growth mask layer 52 for nano-induced growth was performed. A shape of the finally formed second nanowire may be obtained by the above etching step.

Figure 1I:
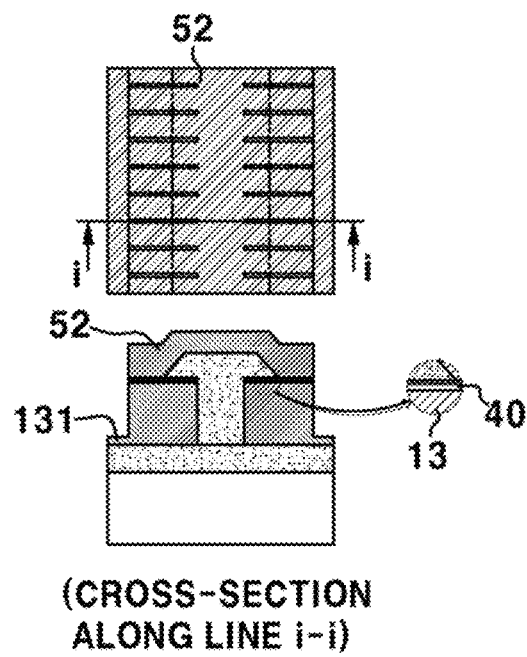

Next, as in FIG. 1i, a second nanowire forming step S700 of forming the second nanowire 60 from the second seed layer 51 in the nanotunnel 40 by induced growth was performed.

That is, the second nanowire forming step S700 may finally form the second nanowire 60, wherein the shape of the second nanowire 60 may be the same or similar to that of the first nanowire previously formed.

Thus, the second nanowire 60 may be formed of a nitride nanowire, and the second nanowire forming step S700 may form the nitride nanowire by the induced growth of a nitride from the second seed layer 51.

That is, as described above, in the embodiment of the step seed growth as the first embodiment, step-by-step seed formation may be performed in which the second seed layer was formed by using the first seed layer as a seed, and the second nanowire was formed by using the second seed layer as a seed.

Figure 1J:
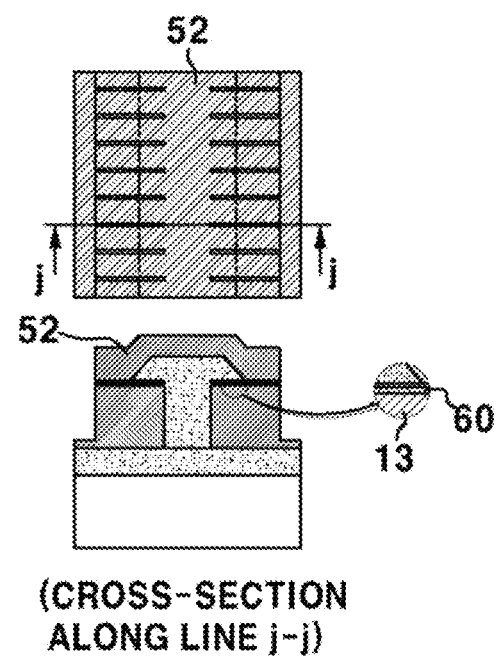

Thereafter, as a finishing process, a mask removing step S810 of removing the nanomask layer 30, the first growth mask layer 13, and the second growth mask layer 52 was performed as in FIG. 1j.

Thus, a nanowire array having a predetermined pattern may be obtained.

The embodiment of the step seed growth will be suitable for forming a plurality of nanowires or a larger nanowire.

A specific example of the embodiment of the step seed growth, as the first embodiment, will be described with reference to FIGS. 1a-1k below.

First, a substrate was prepared in which GaN (first seed layer 12) was grown on a c-plane sapphire substrate 11 as a base layer 10 by using metal organic chemical vapor deposition (MOCVD). As in FIG. 1b, $SiO_2$, as a first growth mask layer 13, was deposited on the prepared substrate to a thickness of 1 μm by using PECVD.

Patterning of an organic nanowire (PVK) array using a nozzle printing method was performed on the $SiO_2$ to form an organic nanowire, as a first nanowire 20, as in FIG. 1(c). The first nanowire was formed to a diameter of 200 nm.

Thereafter, as in FIG. 1d, a nanomask layer 30 for the formation of the nanowire was deposited to a thickness of 30 nm by sputtering. For the formation of a nanotunnel 40, etching of the $SiO_2$ nanomask layer 30 and the first growth mask layer 13 using photolithography and inductively coupled plasma-reactive ion etching (ICP-RIE) was performed as in FIG. 1e. The nanotunnel 40 may be formed by removing the organic nanowire in the nanomask layer 30 as in FIG. 1f, wherein the heat treatment was performed at 400° C. for 2 hours in a furnace. Thus, the nanotunnel 40, a long hole, was formed between the nanomask layer 30 and the first growth mask layer 13.

In a state in which the GaN first seed layer 12 under the nanotunnel 40 was exposed, a second seed layer 51 was formed by regrowing GaN through MOCVD as in FIG. 1g. Conditions of the regrowth were the same as growth conditions (1050° C., 400 mbar) of the GaN first seed layer under the nanotunnel 40, and the regrowth was performed for 10 minutes except for a nucleation process.

Subsequently, as in FIG. 1h, an $SiO_2$ second growth mask layer was deposited to 200 nm through PECVD, and a residual layer 131 was formed on the first seed layer by etching $SiO_2$, as the first growth mask layer 13, through ICP-RIE until just before the GaN layer, as the first seed layer, was exposed as in FIG. 1i.

This was to prevent a process of growing GaN into a nitride from the first seed layer 12 by the residual layer 131 in an area that was not applicable when the induced growth of the GaN second nanowire was performed. As in FIG. 1j, the regrown GaN was allowed to be induced grown from the GaN second seed layer 51, which was connected to the inside of the nanotunnel 40, through the GaN growth by MOCVD, and the growth was performed under conditions including a temperature of 1,050° C. for 20 minutes at 50 mbar. Finally, as in FIG. 1k, a final nanowire structure was obtained by removing the nanomask layer, the first growth mask layer, and the second growth mask layer through a $SiO_2$ etching process using HF.

Example 2

Next, as in the example of FIGS. 2a-2k, an embodiment of the batch seed growth, in which a seed tunnel was first formed on a substrate 11 of a base layer 10 and a second seed layer and a second nanowire 60 were formed together with respect to the seed tunnel and a nanotunnel 40 by using a first seed layer formed on the substrate 11 as a seed, will be examined.

With respect to the embodiment of the batch seed growth, as in the first embodiment, basic embodiment steps and materials constituting configurations for each step or layer configuration follow basic descriptions of the method of manufacturing a nanowire array of the invention which have been previously described.

In addition to the basic descriptions, detailed configuration and steps of the embodiment of the batch seed growth, as the second embodiment, will be examined.

First, as in the first embodiment, a first seed layer forming step S110 of forming a first seed layer 12 on the substrate 11 was performed.

A first growth mask layer forming step S120 of forming a first growth mask layer 13 on the first seed layer 12 was performed. However, different from the first embodiment, an etching process was further added or a patterning method was used to form a seed tunnel 35', in which a portion of the first seed layer 12 was exposed, on the first growth mask layer 13.

That is, as in FIG. 2b, since a seed tunnel forming step S150 of forming the seed tunnel 35' was performed by etching a predetermined area of the first growth mask layer 13, the portion of the first seed layer 12 was exposed by the seed tunnel 35'.

In a state in which the first seed layer 12 and the first growth mask layer 13 were formed, a first nanowire forming step S200 of forming a first nanowire 20 on the first growth mask layer 13 was performed as in FIG. 2c.

The first nanowire 20 may be formed of an organic material and may be removed by a process such as a heat treatment, and a second nanowire, which was desired to be finally prepared at a position where the first nanowire was disposed, may then be prepared.

The first nanowire 20 had a nanoscale thickness, wherein various methods may be used as a method of forming the first nanowire as previously described.

Figure 2D:
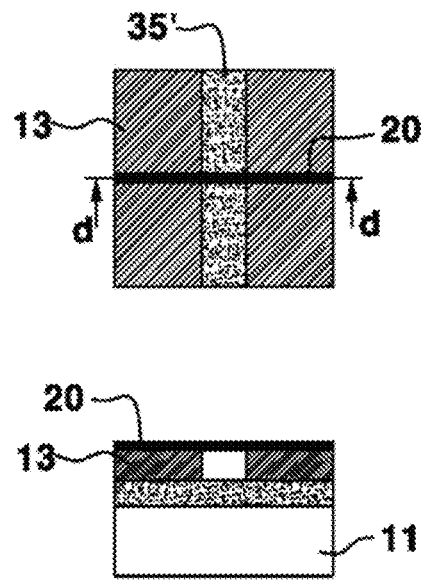

Next, as in FIG. 2d, a nanomask layer forming step S300 of forming a nanomask layer 30 on the first nanowire 20 was performed.

The nanomask layer 30 may be formed in a shape surrounding the first nanowire 20, and the first nanowire 20 was surrounded by the nanomask layer 30 and the first growth mask layer 13.

Figure 2E:
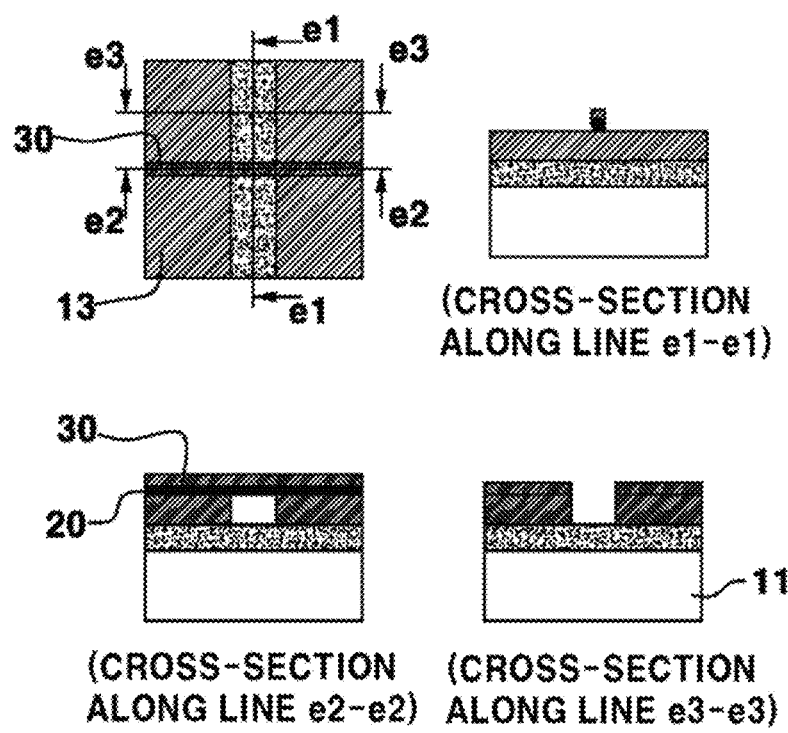
Figure 2F:
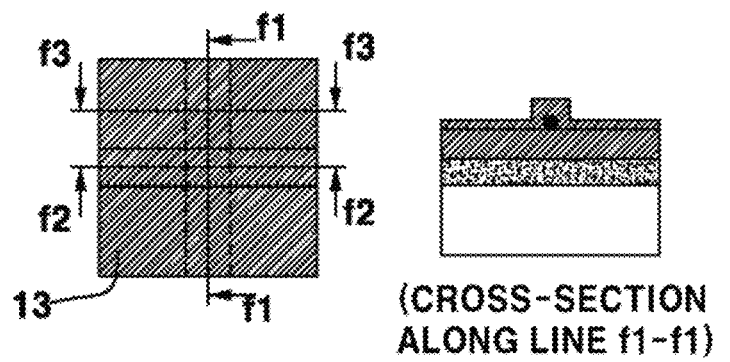

As in FIG. 2e, the nanomask layer 30 was formed, and a nanotunnel forming step S500 of forming the nanotunnel 40 by removing the organic first nanowire 20 through a heat treatment was then performed.

The first nanowire 20 may be formed of an organic nanowire of an organic material, the nanomask layer 30 was formed by using the organic nanowire as a template, and the nanotunnel forming step S500 may then form a nanotunnel by removing the organic nanowire through a heat treatment process. The heat treatment process may form the nanotunnel by removing the organic nanowire through a heat treatment at a temperature of 100° C. to 500° C. The organic material removed by the heat treatment was discharged through the seed tunnel 35'.

Next, a second nanowire forming step S700 of forming the second nanowire 60 from the first seed layer 12 in the seed tunnel 35' and the nanotunnel 40 by induced growth was performed.

Thereafter, as a finishing step, a mask removing step S810' of removing the nanomask layer 30 and the first growth mask layer 13 was performed.

The second nanowire 60 may be formed of a nitride nanowire, and the second nanowire forming step S700 may form the nitride nanowire by the induced growth of a nitride from the first seed layer 12.

That is, in the embodiment of the batch seed growth as the second embodiment, the second seed layer and the second nanowire may be formed together by induced growth using the first seed layer 12 as a seed.

The embodiment of the batch seed growth as the second embodiment will be more suitable for forming a small number of nanowires or a small nanowire.

A specific example of the embodiment of the batch seed growth, as the second embodiment, will be described with reference to FIG. 2 below.

First, as in the previous first embodiment, a substrate was prepared in which a GaN first seed layer 12 was grown on a c-plane sapphire substrate 11 as a base layer 10 by using metal organic chemical vapor deposition (MOCVD) as in FIG. 2a. As in FIG. 2b, $SiO_2$, as a first growth mask layer 13, was deposited on the prepared substrate to a thickness of 300 nm by using PECVD, and the first seed layer was exposed through photolithography and ICP-RIE to form a seed tunnel 35' as in FIG. 2c.

As in FIG. 2d, PVK (organic nanowire) was formed across the patterned $SiO_2$ first growth mask layer 13 by a nozzle printing method to form a first nanowire 20.

As in FIG. 2e, a nanomask layer 30 was formed by an electron beam deposition method, in which $SiO_2$ was deposited to 600 nm in a vertical direction using a directional deposition method.

Figure 2G:
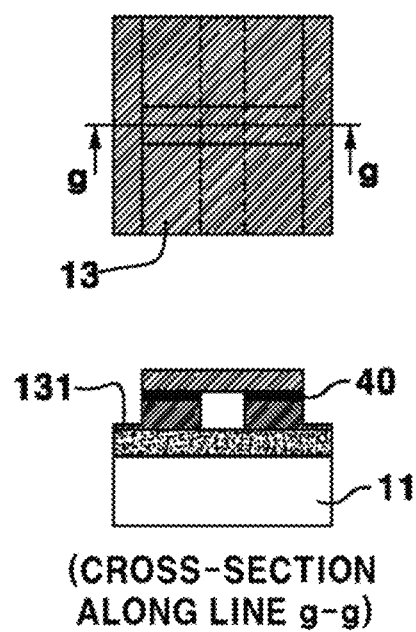
Figure 2H:
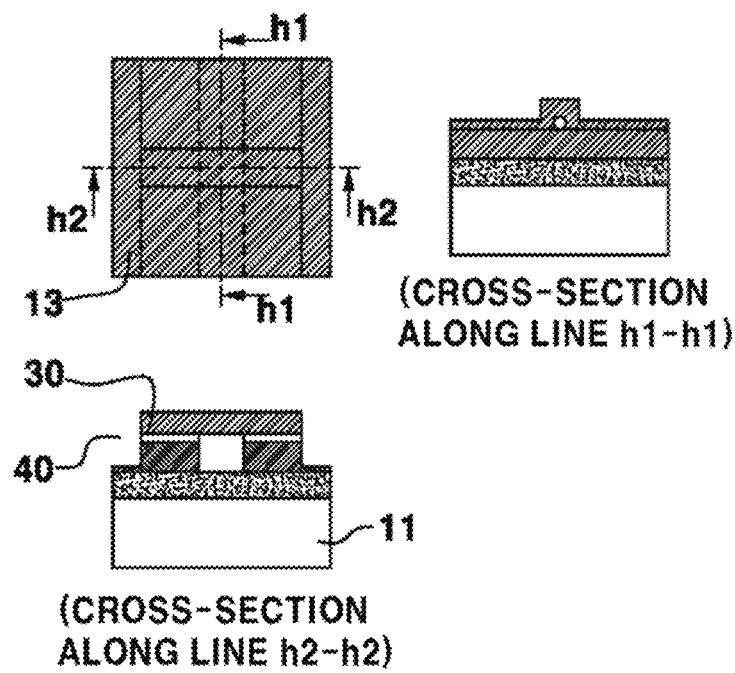
Figure 2I:
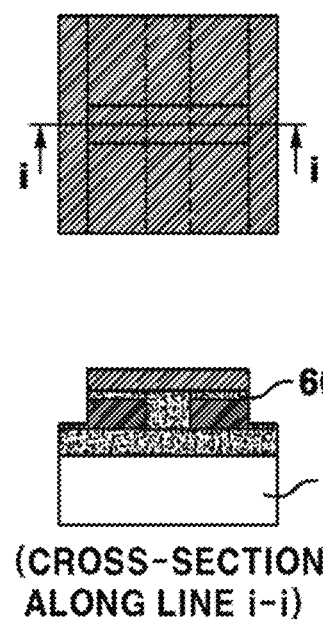

Thereafter, $SiO_2$ was deposited to 200 nm through sputtering, and a residual layer 131 was formed by etching $SiO_2$ through ICP-RIE until just before the lower GaN layer was exposed as in FIG. 2g. This was to prevent a process of growing GaN from an unwanted portion of the first seed nitride when the induced growth of the GaN nanowire was performed.

In order to remove the first nanowire 20 as the organic nanowire, a heat treatment was performed at 400° C. for 2 hours in a furnace. The regrown GaN was allowed to be induced grown from the inner GaN through the GaN growth by MOCVD, and the growth was performed under conditions including a temperature of 1,050° C. for 20 minutes at 50 mbar. A final process was to remove the nanomask layer 30 and the first growth mask layer 13 through a $SiO_2$ etching process using HF as in FIGS. 2j and 2k.

Thus, a nanostructure was prepared in which the nanowire was formed on the substrate.

The invention may form inorganic nanowires from a template of organic nanowires formed in a predetermined shape, wherein the invention has an excellent effect in that the inorganic nanowires may be provided in a predetermined, desired shape because the organic nanowires are formed in a desired shape.

According to another effect of the invention, inorganic nanowires may be stably formed by forming organic nanowires, forming dielectric nanotunnels from the organic nanowires, and forming the inorganic nanowires in the nanotunnels by induced growth.

In addition, according to another effect of the invention, since organic nanowires may be formed on a substrate in a free direction and controlled size, length, and pattern, inorganic nanowires formed in a free pattern, length, size, and direction may be grown by using the organic nanowires.

Also, as a device manufactured by a method of manufacturing a nanowire array according to the invention, a nanostructure including at least one nanowire on a substrate is provided.

Although specific embodiments of the present invention have been described, exemplary embodiments are described in such a manner that the invention may easily be carried out by a person with ordinary skill in the art to which the present disclosure pertains. Accordingly, the scope of the invention should not be construed as being limited to the embodiments set forth herein.

What is claimed is:

1. A method of manufacturing a nanowire array using induced growth, the method comprising:
   a first nanowire forming step of forming a first nanowire on a base layer including a substrate;
   a nanomask layer forming step of forming a nanomask layer on the first nanowire;
   a nanotunnel forming step of forming a nanotunnel by removing the first nanowire after the formation of the nanomask layer; and
   a second nanowire forming step of forming a second nanowire in the nanotunnel by induced growth.

2. The method according to claim 1,
   wherein the substrate comprises any one of:
   nitride having any one of C-plane, M-plane, A-plane, and R-plane;
   nitride having a plane equivalent to any one of C-plane, M-plane, A-plane, and R-plane;
   sapphire having C-plane or R-plane;
   sapphire having a plane equivalent to C-plane or R-plane;
   (111) plane silicon;
   6H—SiC; and
   a material in which a difference in lattice constants between the material and nitride is within 10%.

3. The method according to claim 1,
   wherein the substrate comprises any one of:
   polycrystalline nitride;
   an amorphous material including at least one selected from the group consisting of $SiO_x$ (x=0.5 to 2.5), $SiN_x$ (x=0.5 to 2.5), $Al_2O_3$, GaO, ZnO, LiAlO, and MgO; and
   a material having a surface layer formed of graphene.

4. The method according to claim 1,
   wherein the first nanowire comprises an organic nanowire of an organic material.

5. The method according to claim 1,
   wherein the first nanowire comprises any one low-molecular-weight organic material of:
   6,13-bis(triisopropylsilylethynyl) (TIPS) pentacene;
   triethylsilylethynyl anthradithiophene (TES ADT); and
   [6,6]-phenyl C61 butyric acid methyl ester (PCBM).

6. The method according to claim 1,
   wherein the first nanowire, as a polymer organic semiconductor or a conductive polymer material, comprises any one of:
   a polythiophene derivative including poly(3-hexylthiophene) (P3HT) and poly(3,4-ethylenedioxythiophene) (PEDOT);
   poly(9-vinylcarbazole) (PVK);
   poly(p-phenylene vinylene);
   polyfluorene;
   polyaniline; and
   polypyrrole or a derivative thereof.

7. The method according to claim 1,
   wherein the first nanowire, as an insulating polymer material, comprises any one of:
   polyethylene oxide (PEO);
   polystyrene (PS);
   polycaprolactone (PCL);
   polyacrylonitrile (PAN);
   poly(methyl methacrylate) (PMMA);
   polyimide;
   poly(vinylidene fluoride) (PVDF); and
   polyvinylchloride (PVC).

8. The method according to claim 1,
   wherein the nanomask layer comprises any one of $SiO_x$ (x=0.5 to 2.5), $SiN_x$(x=0.5 to 2.5), $Al_2O_3$, and GaO.

9. The method according to claim 1,
   wherein the second nanowire comprises any one inorganic material of:
   $Al_xGa_yIn_{1-x-y}N$ (0≤x≤1, 0≤y≤1);
   $Al_xGa_yIn_{1-x-y}As$ (0≤x≤1, 0≤y≤1); and
   $Al_xGa_yInP$ (0≤x≤1, 0≤y≤1).

10. The method according to claim 1,
    wherein the second nanowire comprises a nitride nanowire, and
    in the second nanowire forming step, a nitride nanowire is formed by induced growth of a nitride from a seed layer formed on the substrate.

11. The method according to claim 1,
    wherein, in the nanotunnel forming step, the nanomask layer is formed by using the organic nanowire as a template and the nanotunnel is formed by removing the organic nanowire through a heat treatment process.

12. The method according to claim 11,
    wherein, in the nanotunnel forming step, the nanotunnel is formed by removing the organic nanowire through a heat treatment at a temperature of 100° C. to 500° C.

13. The method according to claim 1,
    wherein the base layer has any one layer structure of:
    a layer structure including the substrate;
    a layer structure including the substrate and a first seed layer formed on the substrate; and
    a layer structure including the substrate, the first seed layer formed on the substrate, and a first growth mask layer formed on the first seed layer.

14. The method according to claim 13,
    wherein the first seed layer comprises any one of:
    $Al_xGa_yIn_{1-x-y}N$ (0≤x≤1, 0≤y≤1);
    $Al_xGa_yIn_{1-x-y}As$ (0≤x≤1, 0≤y≤1); and
    $Al_xGa_yInP$ (0≤x≤1, 0≤y≤1).

15. The method according to claim 13,
    wherein the first growth mask layer comprises any one of $SiO_x$(x=0.5 to 2.5), $SiN_x$(x=0.5 to 2.5), $Al_2O_3$, and GaO.

16. The method according to claim 1,
    wherein the first nanowire forming step is performed by any one method of:
    a method of forming an organic nanowire using a nozzle printer;
    nanoimprint lithography;
    electron beam lithography;
    a solution deposition method;
    a vapor transport method;
    a solution annealing method;
    an anodized aluminum template method; and
    a direct tip drawing method.

17. The method according to claim 1,
wherein the nanomask layer forming step is performed by any one method of plasma enhanced chemical vapor deposition (PECVD), chemical vapor deposition (CVD), sputtering, and atomic layer deposition (ALD).

18. The method according to claim 1,
wherein the second nanowire forming step is performed by any one of metal organic chemical vapor deposition (MOCVD), CVD, and a solution process,
wherein the induced growth of the second nanowire is performed along the nanotunnel.

19. A method of manufacturing a nanowire array using induced growth, the method comprising:
a first seed layer forming step of forming a first seed layer on a substrate;
a first growth mask layer forming step of forming a first growth mask layer on the first seed layer;
a first nanowire forming step of forming an organic first nanowire on the first growth mask layer;
a nanomask layer forming step of forming a dielectric nanomask layer on the first nanowire;
a seed tunnel forming step of forming a predetermined seed tunnel by etching the first growth mask layer, the first nanowire, and the nanomask layer;
a nanotunnel forming step of forming a nanotunnel by removing the organic first nanowire;
a second seed layer forming step of forming a second seed layer from the first seed layer in the seed tunnel;
a second growth mask layer forming step of forming a second growth mask layer on the second seed layer;
an induced growth etching step of etching a predetermined area of the second growth mask layer for nano-induced growth;
a second nanowire forming step of forming a second nanowire from the second seed layer in the nanotunnel by induced growth; and
a mask removing step of removing the nanomask layer, the first growth mask layer, and the second growth mask layer.

20. The method according to claim 19,
wherein the second nanowire comprises a nitride nanowire, and
in the second nanowire forming step, a nitride nanowire is formed by induced growth of a nitride from the second seed layer.

21. The method according to claim 19,
wherein the first nanowire comprises an organic nanowire of an organic material, and
in the nanotunnel forming step, the nanomask layer is formed by using the organic nanowire as a template and the nanotunnel is formed by removing the organic nanowire through a heat treatment process,
wherein the heat treatment process forms the nanotunnel by removing the organic nanowire through a heat treatment at a temperature of 100° C. to 500° C.

22. The method according to claim 19,
wherein the seed tunnel forming step comprises a dry etching process or a wet etching process.

23. The method according to claim 19,
wherein the second seed layer forming step is performed by any one of metal organic chemical vapor deposition (MOCVD), molecular beam epitaxy (MBE), sputtering, and electron beam deposition to form the second seed layer of a nitride structure.

24. A method of manufacturing a nanowire array using induced growth, the method comprising:
a first seed layer forming step of forming a first seed layer on a substrate;
a first growth mask layer forming step of forming a first growth mask layer on the first seed layer;
a seed tunnel forming step of forming a seed tunnel by etching a predetermined area of the first growth mask layer;
a first nanowire forming step of forming a first nanowire on the first growth mask layer;
a nanomask layer forming step of forming a nanomask layer on the first nanowire;
a nanotunnel forming step of forming a nanotunnel by removing the organic first nanowire after the formation of the nanomask layer;
a second nanowire forming step of forming a second nanowire from the first seed layer in the seed tunnel and the nanotunnel by induced growth; and
a mask removing step of removing the nanomask layer and the first growth mask layer.

25. The method according to claim 24,
wherein the second nanowire comprises a nitride nanowire, and
in the second nanowire forming step, a nitride nanowire is formed by induced growth of a nitride from the first seed layer.

26. The method according to claim 24,
wherein the first nanowire comprises an organic nanowire of an organic material, and
in the nanotunnel forming step, the nanomask layer is formed by using the organic nanowire as a template and the nanotunnel is formed by removing the organic nanowire through a heat treatment process,
wherein the heat treatment process forms the nanotunnel by removing the organic nanowire through a heat treatment at a temperature of 100° C. to 500° C.

27. A nanostructure comprising:
a seed tunnel having a predetermined depth prepared by etching a predetermined area of a first growth mask layer; and
a nanotunnel having one side thereof connected to the seed tunnel, which is covered with a mask layer and constitutes a through-hole,
wherein the first growth mask layer having a predetermined thickness is formed on a first seed layer on a substrate.

* * * * *